(12) United States Patent
Kuwabara

(10) Patent No.: US 6,560,762 B2
(45) Date of Patent: May 6, 2003

(54) SEMICONDUCTOR INTEGRATED CIRCUIT AND WIRING METHOD

(75) Inventor: Sumio Kuwabara, Tokyo (JP)

(73) Assignee: NEC Corporation, Tokyo (JP)

( * ) Notice: Subject to any disclaimer, the term of this patent is extended or adjusted under 35 U.S.C. 154(b) by 80 days.

(21) Appl. No.: 09/760,773

(22) Filed: Jan. 17, 2001

(65) Prior Publication Data

US 2001/0025365 A1 Sep. 27, 2001

(30) Foreign Application Priority Data

Jan. 18, 2000 (JP) ........................................ 2000-009222

(51) Int. Cl.[7] .............................................. G06F 17/50
(52) U.S. Cl. ............................................. 716/12; 716/1
(58) Field of Search .................. 716/1–14, 18; 313/495; 257/508

(56) References Cited

U.S. PATENT DOCUMENTS 5,185,650 A * 2/1993 Wakimoto et al. ........... 257/508
5,438,524 A * 8/1995 Komoda ...................... 716/18
5,831,387 A * 11/1998 Kaneko et al. ............... 313/495
5,852,562 A * 12/1998 Shinomiya et al. ............ 716/10

FOREIGN PATENT DOCUMENTS

| JP | 6-84913 A | 3/1994 | |
| JP | 6-334157 A | 12/1994 | |
| JP | 406268370 A | * 12/1994 | ............ H05K/3/46 |
| JP | 8-129574 | 5/1996 | |
| JP | 10-256250 | 9/1998 | |
| JP | 11168173 A | * 6/1999 | ............ H01L/24/04 |

* cited by examiner

Primary Examiner—Vuthe Siek
Assistant Examiner—Sun James Lin
(74) Attorney, Agent, or Firm—Sughrue Mion, PLLC

(57) ABSTRACT

In the semiconductor integrated circuit of the present invention, an n-channel MOS transistor and a p-channel MOS transistor, which are a plurality of circuit components that have been designed beforehand, are connected by means of wiring as a portion of a configuration content. Both a power supply potential wiring layer for supplying a power supply potential to circuit components and a ground potential wiring layer for supplying a ground potential to the circuit components are provided between the wiring used to connect together nodes inside the circuit components and the wiring between circuit components so as to generally cover the circuit components.

12 Claims, 3 Drawing Sheets

SEMICONDUCTOR INTEGRATED CIRCUIT AND WIRING METHOD

BACKGROUND OF THE INVENTION

1. Field of the Invention

The present invention relates to a semiconductor integrated circuit, and particularly to a semiconductor integrated circuit wiring method for forming a portion of the structural content by connecting a plurality of circuit components that have been designed beforehand, and the associated semiconductor integrated circuit.

2. Description of the Related Art

As shown in, for example, Japanese Patent Laid-open No. 129574/96, the internal wiring of this type of semiconductor integrated circuit was typically realized by assigning a lower layer chiefly for the circuit component internal wiring and using an upper layer chiefly for wiring between circuit components with the chief aim of decreasing the number of wiring layers that are required in the integrated circuit. With the development toward miniaturization, however, the mutual interference arising between the wiring layer for connections inside circuit components used on the lower layer and the wiring layer for connections between circuit components used on the upper layer in the method of apportioning the above-described wiring layers of the prior art can no longer be ignored. As described in Japanese Patent Laid-open No. 256250/98, one known method of preventing malfunctioning of the integrated circuit arising from this interference involves forming a shielding structure that uses a conductive layer between the circuit component internal wiring and the wiring between circuit components or wiring between other adjacent circuit components.

In a typical semiconductor integrated circuit, however, methods of reducing the total amount of design that is required for development are widely used in which circuit components that have been designed beforehand are used as the constituent elements in the interest of shortening the development period. In such cases, the problem has been encountered that mutual interference resulting from the addition of inter-circuit component wiring for circuit components that were designed beforehand could not be predicted at the time of designing the circuit components, and this has resulted both in delays in the development phase due to the need to reconsider the content of circuit component design when configuring an integrated circuit and in problems with the completed integrated circuits.

In the case of Japanese Patent Laid-open No. 256250/98, moreover, a method was disclosed for sharing a shield structure against mutual interference with either the wiring for supplying the power supply potential or the wiring for supplying the around potential. In this method, the addition of wiring becomes necessary at the time of configuring the integrated circuit in order to additionally supply other potentials. This method therefore necessitates the reconsideration of the design of the circuit components because the new mutual interference brought about by the wiring addition affects the circuit components.

SUMMARY OF THE INVENTION

It is an object of the present invention to provide a semiconductor integrated circuit and a semiconductor integrated circuit wiring method that keep to a minimum the need to reappraise the effects of mutual interference on the operation of circuit components and thus shorten the development stage or enable larger-scale integration.

The method of wiring a semiconductor integrated circuit according to the present invention is a method of wiring a semiconductor integrated circuit that is formed as a portion of a configuration content by connecting a plurality of circuit components that have been designed beforehand; and includes a step in which both a power supply potential wiring layer for supplying the power supply potential to the circuit components and a ground potential wiring layer for supplying the ground potential to the circuit components are provided between a wiring layer used for interconnections of nodes Inside circuit components and other wiring layers so as to generally cover the circuit components.

The method of wiring a semiconductor integrated circuit according to the present invention includes forming the power supply potential wiring layer and the ground potential wiring layer by dividing into a plurality of wiring.

The method of wiring a semiconductor integrated circuit of the present invention includes forming a portion of the internal wiring of circuit components or the wiring between circuit components on the same layer as the power supply potential wiring layer and the ground potential wiring layer.

The method of wiring a semiconductor integrated circuit of the present invention includes: forming the power supply potential wiring layer and the ground potential wiring layer independently for each circuit component for a plurality of circuit components; and moreover, configuring necessary connections to the power supply potential wiring layer and the ground potential wiring layer by using connections with another wiring layer that is positioned above the wiring layer.

The method of wiring a semiconductor integrated circuit of the present invention includes the steps of:
   forming a large-scale circuit component using a plurality of small-scale circuit components; and
   further configuring a semiconductor integrated circuit using a plurality of the large-scale circuit components;
   wherein the above-described wiring method is applied in each of the steps.

The method of wiring a semiconductor integrated circuit of the present invention includes forming a power supply potential wiring layer and a ground potential wiring layer in a comb shape.

By adopting this type of wiring method, a layer of fixed potential that is constituted by the power supply potential wiring layer or the ground potential wiring layer provides shielding between a circuit component internal wiring layer and an inter-circuit component wiring layer, and mutual interference is thus greatly reduced.

In addition, since the power supply potential wiring layer and ground potential wiring layer both constitute the integrated circuit and serve as the necessary wiring, they can be arranged at the time of designing circuit components without necessitating an increase in the number of new wiring layers. Further, since these wiring layers are both at fixed potentials, the shape of the predetermined wiring layer can be modified according to expedience of connections with adjacent circuit components at the time of configuring an integrated circuit without causing a change in the effect on the circuit component internal wiring.

The semiconductor integrated circuit of the present invention includes:
   a plurality of circuit components that have been designed beforehand and that are formed as a portion of the configuration content by connecting by wiring; a wiring layer that is used for connecting together nodes inside the circuit components;

a power supply potential wiring layer for supplying a power supply potential to the circuit components; and a ground potential wiring layer for supplying the ground potential to the circuit components;

wherein both the power supply potential wiring layer and the ground potential wiring layer are provided between the wiring layer that is used for connecting together nodes inside the circuit components and other wiring layers so as to generally cover the circuit components.

The semiconductor integrated circuit of the present invention includes a form in which the power supply potential wiring layer and the ground potential wiring layer are each formed by dividing into a plurality of wiring.

The semiconductor integrated circuit of the present invention includes a form in which a portion of the wiring inside circuit component or the wiring between circuit components is formed by the same layer as the power supply potential wiring layer and the ground potential wiring layer.

The semiconductor integrated circuit of the present invention includes a form in which the power supply potential wiring layer and ground potential wiring layer are formed independently for each circuit component for a plurality of circuit components, and moreover, in which necessary connections to the power supply potential wiring layer and the ground potential wiring layer are constituted using connections with another wiring layer that is positioned above the wiring layer.

The semiconductor integrated circuit of the present invention is a semiconductor integrated circuit that is constituted using a plurality of large-scale circuit components that are in turn each formed using a plurality of small-scale circuit components; and includes a form in which the above-described wiring method is applied for forming each of the large-scale circuit component and the integrated circuit.

The semiconductor integrated circuit of the present invention includes a form in which the power supply potential wiring layer and the around potential wiring layer are formed in a comb shape.

The above and other objects, features, and advantages of the present invention will become apparent from the following description based on the accompanying drawings which illustrate examples of a preferred embodiment of the present invention.

DETAILED DESCRIPTION OF THE PREFERRED EMBODIMENTS

Figure 1:
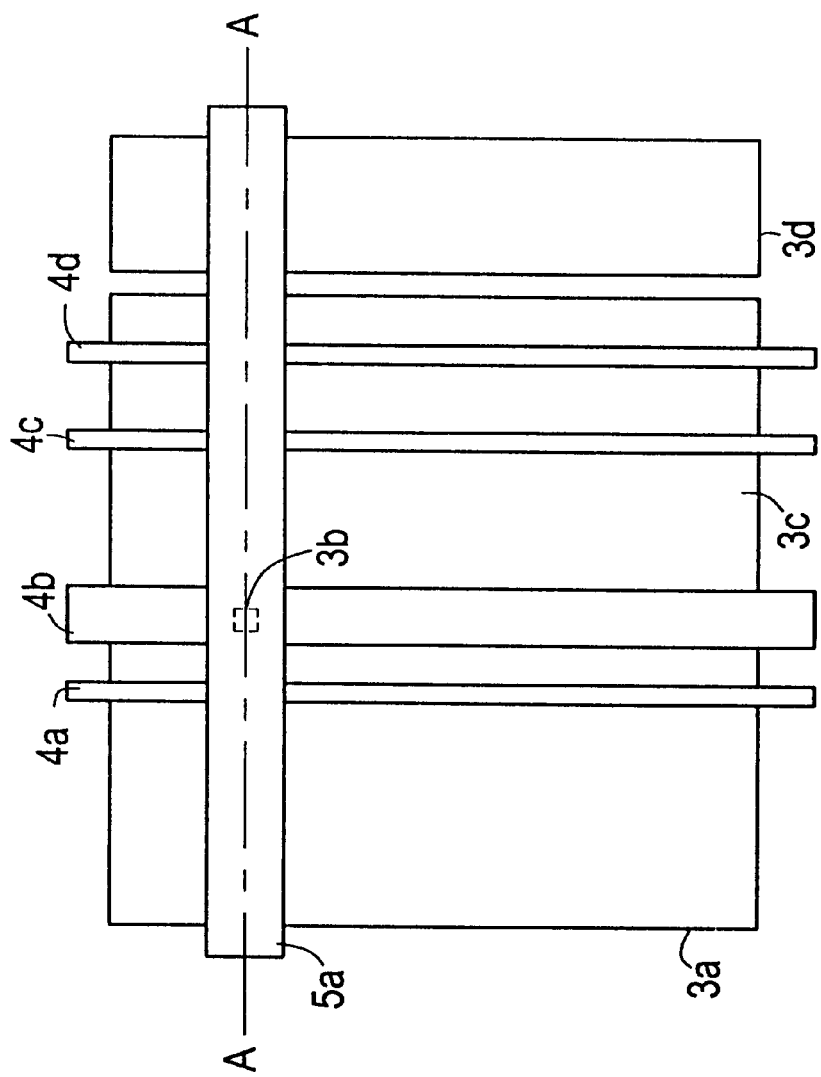
FIG. 1 is an upper plan view of a semiconductor integrated circuit according to the first working example of the present invention.
Figure 2:
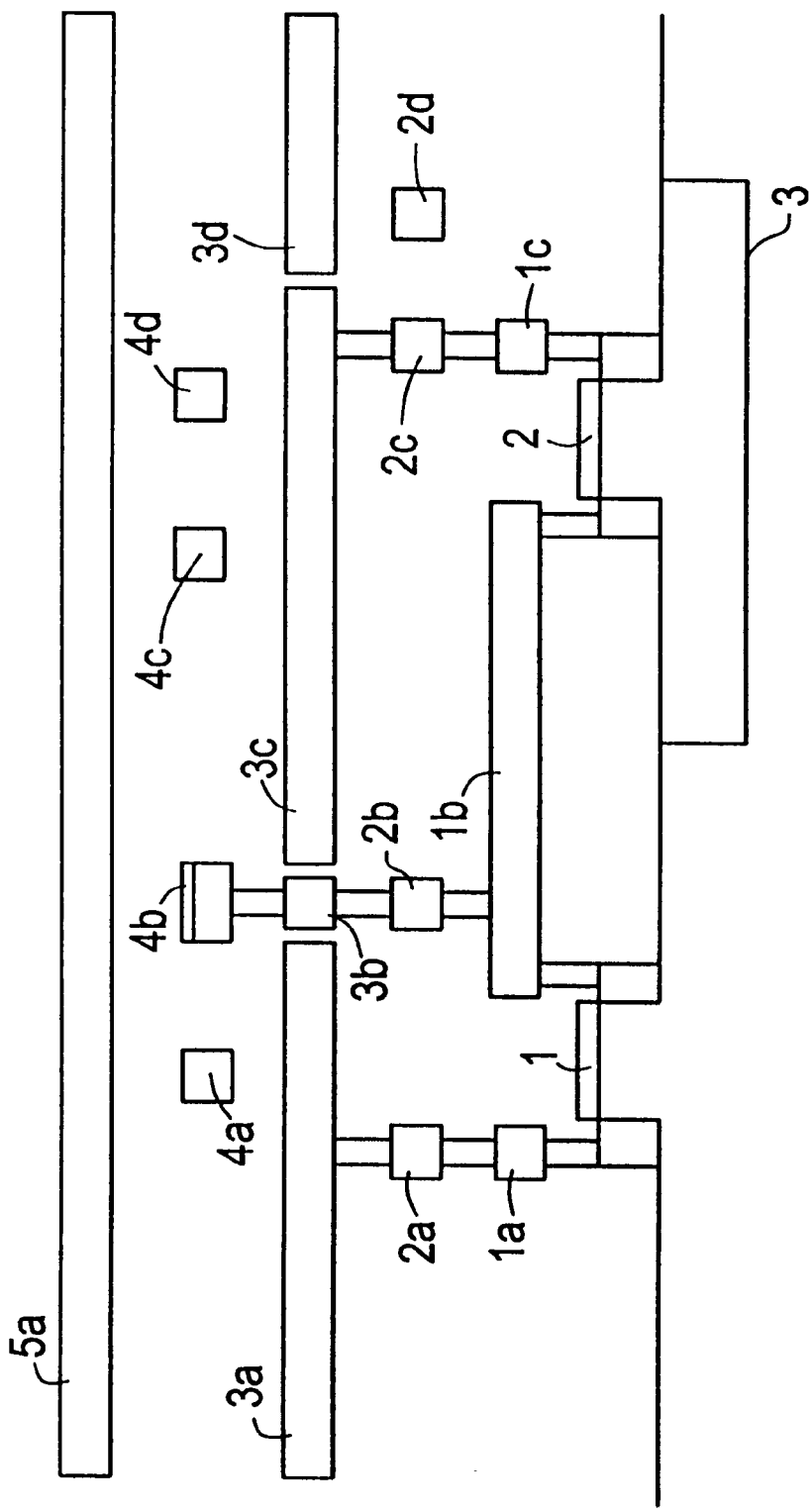
FIG. 2 is a sectional view taken at line A—A of FIG. 1.

Referring now to the figures, FIG. 1 snows an upper plan view of the semiconductor integrated circuit of the first working example of the present invention, while FIG. 2 shows a sectional view at line A—A of FIG. 1.

The semiconductor integrated circuit of FIGS. 1 and 2 is formed by applying the semiconductor integrated circuit wiring method according to the first working example of the invention that is described below.

In the wiring method of a semiconductor integrated circuit according to the first working example of the present invention, at the time of forming a portion of the configuration content by joining a plurality of circuit components that were designed beforehand, both a power supply potential wiring layer for supplying a power supply potential to circuit components and a ground potential wiring layer for supplying a ground potential to circuit components are provided between a wiring layer, which is used for connecting together nodes within circuit components, and other wiring layers, thereby generally covering the circuit components.

In FIGS. 1 and 2, CMOS inverters are shown for only one circuit in the interest of simplifying the explanation.

As its constituent elements, this CMOS inverter includes as circuit components n-channel MOS transistor 1 and p-channel MOS transistor 2 and n-well 3. Wiring 1b and contacts 1a and 1c toward a lower layer are also formed from a first wiring layer (the wiring layers being labeled "First" and "Second" according to the order of occurrence). Wiring 2d and contacts 2a, 2b, and 2c are formed from a second wiring layer. Similarly, wiring 4a, 4b, 4c, and 4d are formed from a fourth, wiring layer, and wiring 5a is formed of a fifth wiring layer that is above the fourth wiring layer. In this case, wiring 1b and 2d are the lower-layer circuit component internal wiring, and wiring 1b connects each of the nodes of n-channel MOS transistor 1 and p-channel MOS transistor 2. Wiring 4a, 4b, 4c, 4d, and 5a is the upper-layer wiring between circuit components. Ground potential wiring layer 3a and 3d and power supply potential wiring layer 3c are formed from the third wiring layer. Ground potential wiring layer 3a is the ground potential wiring layer of this invention, is connected to the nodes of n-channel MOS transistor 1 via contacts 2a and 1a, and supplies the ground potential to this circuit component. Power supply potential wiring layer 3c is the power supply potential wiring layer of this invention, connects to the nodes of p-channel MOS transistor 2 via contacts 2c and 1c, and supplies the power supply potential to this circuit component. Ground potential wiring layers 3a and 3d and power supply potential wiring layer 3c are formed between lower-layer circuit component internal wiring 1b and 2d and upper-layer inter-circuit component wiring 4a, 4b, 4c, 4d, and 5a. In addition, ground potential wiring layer 3a and 3d and power supply potential wiring layer 3c are formed so as to cover the first and second wiring layers and circuit components n-channel MOS transistor 1 and p-channel MOS transistor 2. These wiring layers and circuit components are not shown in the plan view of FIG. 1 because they are covered by wiring layers 3a, 3d, and 3c.

In this working example, portions in the first wiring layer other than the contacts at which the circuit component internal wiring that is indicated by 1b must be connected to the inter-circuit component wiring are generally covered by 3a and 3d, which is the ground potential wiring layer, and 3c, which is the power supply potential wiring layer. The circuit component internal wiring is thus shielded from the inter-circuit component wiring, and interference does not occur.

Figure 3:
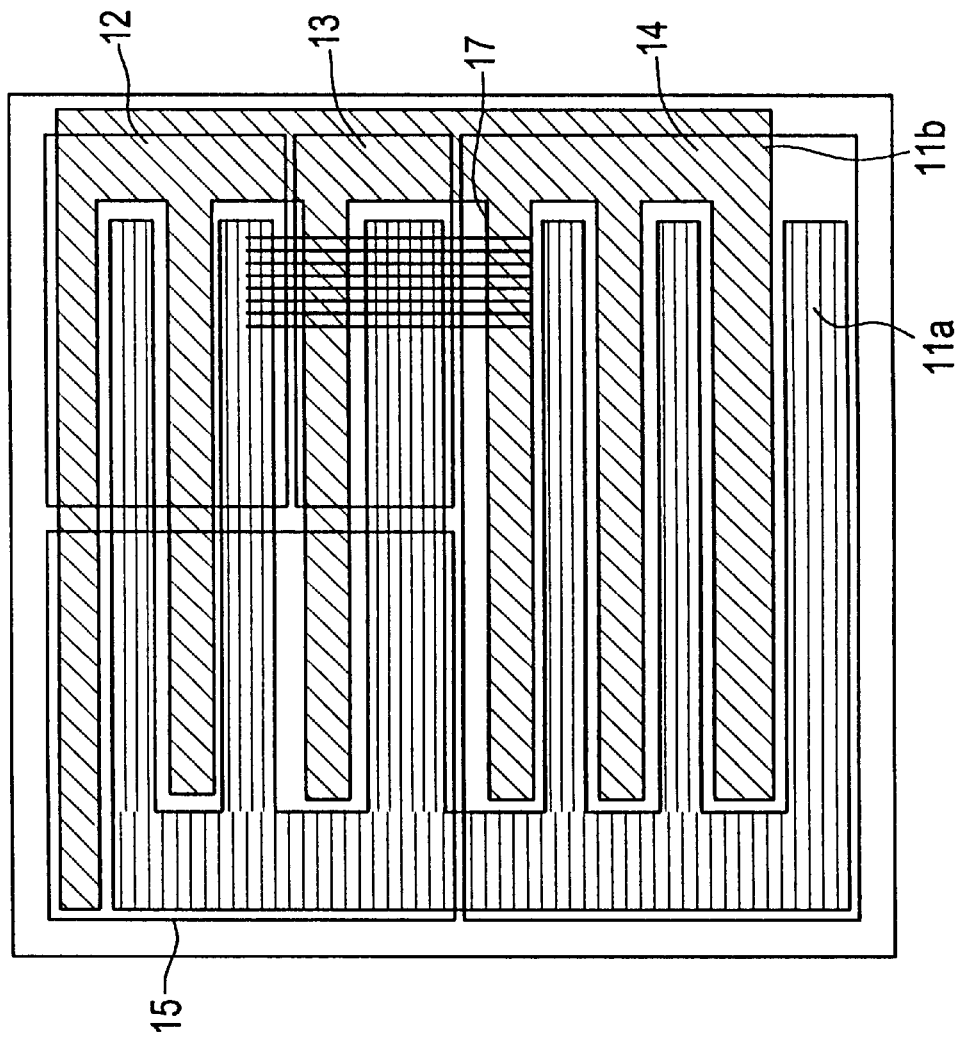
FIG. 3 is a schematic diagram showing the arrangement of circuit components in the second working example of the semiconductor integrated circuit of the present invention.

The effect of the present invention is next explained using an actual working example. FIG. 3 shows a schematic plan view of the second working example of the semiconductor integrated circuit in which the wiring method of this invention has been adopted.

In FIG. 3, power supply potential wiring layer 11a and ground potential wiring layer 11b according to the present invention are both formed in a comb shape. In the figure, the spacing has been widened to clearly show that the two wiring layers are separate wiring, but in actuality, the spacing is preferably the minimum permitted by mask formation. Reference numerals 12, 13, 14, and 15 indicate the outlines of circuit components that have been designed beforehand. Wiring group 17 connects circuit component 12 and circuit component 14.

Conventionally, an accurate estimate of the parasitic capacitance of the circuit component internal wiring of circuit component 13 could not be realized until the mask layout of the entire semiconductor integrated circuit that used this block as components was determined, but with the present invention, power supply potential wiring layer 11a and ground potential wiring layer 11b are taken as the upper-layer wiring, and interference due to wiring can thus be estimated at the time of designing each circuit component. Even if, according to circumstances of the circuit component arrangement of the entire semiconductor integrated circuit, wiring group 17 should take on the mask layout configuration that passes directly above, wiring group 17 will not be affected because the circuit component internal wiring is shielded by wiring layer 11a and wiring layer 11b. In addition, there is no need to form an extra wiring layer because wiring layer 11a and wiring layer 11b are the wiring layers that are necessary to the operation of each circuit component.

In the above-described working example, the power supply potential wiring layer and ground potential wiring layer can be formed by dividing between a plurality of wiring based on limitations in the fabrication steps of the semiconductor, and this modification brings about no particular loss in effect.

In addition, based on limitations on the number of employed wiring layers, a portion of the circuit component internal wiring or the wiring between circuit components may be formed on the same layer as the power supply potential wiring layer and ground potential wiring layer, and in this case as well, an improvement can be expected due to the shielding of the remaining main portion of wiring.

Still further, the power supply potential wiring layer and ground potential wiring layer may be formed independently for each circuit component for a plurality of circuit components, and moreover, necessary connections with the power supply potential wiring layer and ground potential wiring layer can be constituted using connections with other wiring layers that are positioned above the wiring layer. This method can be adopted in cases in which the shape of the power supply potential wiring layer and ground potential wiring layer is predetermined for each circuit component and these circuit components are formed as the same integrated circuit, whereby connections of each of the power supply potential wiring layer and ground potential wiring layer may be impeded between adjacent circuit components.

Furthermore, in a case of forming a large-scale circuit component using a plurality of small-scale circuit components and then constituting a semiconductor integrated circuit using a plurality of these large-scale circuit components, this wiring method can be used in the configuration of each of the circuits.

The present invention is clearly not limited to each of the above-described working examples, each working form being amenable to modification as appropriate within the scope of the technical concept of the present invention.

In the present invention as described in the foregoing explanation, both a power supply potential wiring layer and a ground potential wiring layer are provided between a wiring layer that is used for connecting together nodes within circuit components and other wiring layers so as to generally cover circuit components, whereby a fixed potential layer constituted by the power supply potential wiring layer or the ground potential wiring layer provides shielding between the circuit component internal wiring layer and the inter-circuit component wiring layer, thereby greatly reducing mutual interference. The present invention thus provides a wiring method and a semiconductor integrated circuit in which the effect of mutual interference can be verified at the time of designing circuit components and in which verification of the effect of inter-wiring interference is facilitated at the time of designing a large-scale semiconductor integrated circuit.

In addition, the present invention has the further effect of realizing at lower cost a semiconductor integrated circuit having greatly reduced interference because the power supply potential wiring layer and ground potential wiring layer are both wiring that is required in configuring an integrated circuit and there consequently is no need for an increase in the number of new wiring layers.

Finally, the influence from other components upon the internal wiring of circuit components is fixed at the time of design because the arrangement of the power supply potential wiring layer and ground potential wiring layer that overlay this wiring is fixed; and even if the circuit components should be used in a different integrated circuit, there tends to be little variation in characteristics brought about by differences in the wiring between circuit components for each integrated circuit. This effect is realized because:

1. The arrangement of the power supply potential wiring layer and ground potential wiring layer completes all necessary wiring other than connection wiring for input and output. (In a shielding structure in which only one of the potential wiring is used, the other potential wiring must be additionally installed when the circuit components are used in an integrated circuit, and this additional installation gives rise to new mutual interference.)

2. This effect is realized because the power supply potential wiring layer and ground potential wiring layer provide a shield against the influence from outside signal lines.

Accordingly, the present invention eliminates the likelihood of changes in the characteristics of each of the circuit components that are designed beforehand at the time of configuring an integrated circuit, and the present invention thus has the effect of enabling a great reduction of changes in characteristics of circuit components for an SOC (System On Silicone) design that is designed by appropriating IP (Intellectual Property) if it is assumed in advance that the power supply potential wiring layer and ground potential wiring layer according to the present invention are layers for shielding added at the time of configuring the SOC in each circuit component and if delays due to wiring capacitance are estimated.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A wiring method of a semiconductor integrated circuit formed by:

integrating a plurality of interconnected circuit components in said semiconductor circuit; and positioning both a power supply potential wiring layer for supplying a power supply potential to the circuit components and a ground potential wiring layer for supplying the ground potential to the circuit components between a wiring layer used for interconnections of nodes inside the circuit components and other wiring layers so as to physically cover the circuit components and electrically isolate said circuit components from said wiring layers.

2. A wiring method of a semiconductor integrated circuit according to claim 1 wherein said power supply potential wiring layer and said ground potential wiring layer are formed by dividing into a plurality of wirings.

3. A wiring method of a semiconductor integrated circuit according to claim 1 wherein a portion of the internal wiring of circuit components or wiring between circuit components is formed on the same layer as said power supply potential wiring layer and said ground potential wiring layer.

4. A wiring method of a semiconductor integrated circuit according to claim 1, comprising steps of:

forming said power supply potential wiring layer and said ground potential wiring layer independently for each circuit component for a plurality of circuit components; and moreover, configuring necessary connections to said power supply potential wiring layer and ground potential wiring layer by using connections with another wiring layer that is positioned above the wiring layer.

5. A wiring method of a semiconductor integrated circuit, comprising the steps of:

forming a large-scale circuit component using a plurality of small-scale circuit components; and further configuring a semiconductor integrated circuit using a plurality of said large-scale circuit components;

wherein the wiring method according to claim 1 is applied in each of said steps.

6. A wiring method of a semiconductor integrated circuit according to claim 1 wherein said power supply potential wiring layer and said ground potential wiring layer are formed in a comb shape.

7. A semiconductor integrated circuit comprising:

a plurality of circuit components inside said semiconductor integrated circuit;

a wiring layer that is used for connecting together nodes inside the circuit components;

a power supply potential wiring layer for supplying a power supply potential to the circuit components; and a ground potential wiring layer for supplying a ground potential to the circuit components;

wherein both said power supply potential wiring layer and said ground potential wiring layer are provided between said wiring layer that is used for connecting together nodes inside the circuit components and other wiring layers so as to physically cover said circuit components and electrically isolate said circuit components from said wiring layers.

8. A semiconductor integrated circuit according to claim 7 wherein said power supply potential wiring layer and said ground potential wiring layer are each formed by dividing into a plurality of wirings.

9. A semiconductor integrated circuit according to claim 7 wherein a portion of the wiring inside circuit components or the wiring between circuit components is formed on the same layer-as said power supply potential wiring layer and said ground potential wiring layer.

10. A semiconductor integrated circuit according to claim 7 wherein said power supply potential wiring layer and said ground potential wiring layer are formed independently for each circuit component for a plurality of circuit components, and moreover, wherein necessary connections to said power supply potential wiring layer and said ground potential wiring layer are configured using connections with another wiring layer that is positioned above the wiring layer.

11. A semiconductor integrated circuit that is configured using a plurality of large-scale circuit components that are in turn each formed using a plurality of small-scale circuit components; wherein the wiring method as described in claim 1 is applied for forming each large-scale circuit component and integrated circuit.

12. A semiconductor integrated circuit according to claim 7 wherein said power supply potential wiring layer and said ground potential wiring layer are each formed in a comb shape.

* * * * *